(12) United States Patent
Sakai et al.

(10) Patent No.: US 6,509,718 B2
(45) Date of Patent: Jan. 21, 2003

(54) BATTERY PACK DIAGNOSTIC METHOD AND BATTERY PACK DIAGNOSTIC APPARATUS

(75) Inventors: Kenichi Sakai, Hadano (JP); Tomonaga Sugimoto, Fujisawa (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 09/906,141

(22) Filed: Jul. 17, 2001

(65) Prior Publication Data

US 2002/0011822 A1 Jan. 31, 2002

(30) Foreign Application Priority Data

Jul. 18, 2000 (JP) .......................... 2000-217358

(51) Int. Cl.[7] .................................. H02J 7/00
(52) U.S. Cl. ........................ 320/134; 320/116
(58) Field of Search ................. 320/134, 116, 320/118, 132, 165, DIG. 20, DIG. 21; 324/429, 430, 433

(56) References Cited

U.S. PATENT DOCUMENTS 5,206,578 A * 4/1993 Nor .......................... 320/134
5,773,958 A * 6/1998 Gow et al. .................. 320/134
6,072,300 A * 6/2000 Tsuji .......................... 320/116

FOREIGN PATENT DOCUMENTS

JP         11-149944         6/1999

* cited by examiner

*Primary Examiner*—Edward H. Tso
*Assistant Examiner*—Lawrence Luk
(74) *Attorney, Agent, or Firm*—McDermott, Will & Emery

(57) ABSTRACT

A battery pack diagnostic apparatus that performs diagnosis on a plurality of cells constituting a battery pack measures the current flowing through the battery pack and starts a cell voltage measurement at the terminals of each cell when the absolute value of the measured current flowing through the battery pack has sustained a level equal to or lower than a predetermined value over a specific length of time. By detecting a faulty cell based upon the measured cell voltage value at individual cells thus obtained, a cell failure occurring while the battery pack is used in a normal state such as while the vehicle is in a running state can be detected reliably.

11 Claims, 5 Drawing Sheets

BATTERY PACK DIAGNOSTIC METHOD AND BATTERY PACK DIAGNOSTIC APPARATUS

BACKGROUND OF THE INVENTION

1. Field of the Invention

The present invention relates to a diagnostic method and a diagnostic apparatus adopted to detect a failure in a cell among cells constituting a battery pack.

2. Description of the Related Art

The individual capacities and the like of a plurality of cells constituting a battery pack change in correspondence to the charge/discharge current during a charge/discharge and thus, the inconsistency among the individual cell capacities cannot be detected accurately during the charge/discharge. As a solution, a battery pack diagnostic apparatus has been disclosed in the known art (see Japanese Laid-Open Patent Publication No. H11-149944), which measures the cell voltages at a vehicle startup or a charge start when the cells are in a stable state and detects a faulty cell based upon the measured cell voltage values.

SUMMARY OF THE INVENTION

However, the battery pack diagnostic apparatus in the prior art, which is capable of performing diagnosis on the battery pack only at a vehicle startup or at a charge start, cannot detect a cell failure occurring while the battery pack is in normal use, such as while the vehicle is running. Thus arises a problem in that appropriate measures cannot be taken when such a cell failure occurs.

An object of the present invention is to provide a battery pack diagnostic method and a battery pack diagnostic apparatus that enable accurate diagnosis on any failure occurring in the battery pack while the battery pack is in normal use.

The battery pack diagnostic apparatus according to the present invention performs diagnosis on a plurality of cells constituting a battery pack. The battery pack diagnostic apparatus comprises a current measuring instrument that measures the current flowing through the battery pack, a voltage measuring instrument that measures a cell voltage at the terminals of each cell, a measurement control device that starts the cell voltage measurement by the voltage measuring instrument when the absolute value of the current flowing through the battery pack measured by the current measuring instrument has sustained a level equal to or lower than a predetermined value over a specific length of time and a faulty cell detection device that detects a faulty cell based upon measured cell voltage values at the individual cells.

Alternatively, the battery pack diagnostic apparatus according to the present invention may comprise a current measuring instrument that measures the current flowing through the battery pack, a voltage measuring instrument that measures cell voltage at the terminals of each cell, a measurement control device that starts the cell voltage measurement by the voltage measuring instrument when the absolute value of the current flowing through the battery pack measured by the current measuring instrument has sustained a level equal to or lower than a predetermined value over the specific length of time and a faulty cell detection device that detects a faulty cell based upon the measured cell voltage values at the individual cells detected by the voltage measuring instrument, and the measurement control device may start the cell voltage measurement anew if the absolute value of the current flowing through the battery pack exceeds the predetermined value during the cell voltage measurement by the voltage measuring instrument or if the absolute value of the difference between the maximum value and the minimum value of the current flowing through the battery pack exceeds a predetermined value, to perform diagnosis on the plurality of cells constituting the battery pack.

In the battery pack diagnostic method according to the present invention, a cell voltage is measured at the terminals of each cell when the absolute value of the current flowing through the battery pack has sustained a level equal to or lower than a predetermined value over a specific length of time and a faulty cell is detected based upon measured cell voltages. The method enables a diagnosis to be performed on a plurality of cells constituting the battery pack.

Alternatively, in the battery pack diagnostic method comprising, measuring a cell voltage anew if the absolute value of the current flowing through the battery pack exceeds a predetermined value during a cell voltage measurement or if the absolute value of the difference between the maximum value and the minimum value of the current flowing through the battery pack exceeds a predetermined value during a cell voltage measurement, and to detect a faulty cell based upon the measured cell voltages.

DETAILED DESCRIPTION OF THE PREFERRED EMBODIMENT

The battery pack diagnostic apparatus according to the present invention is explained in reference to an embodiment in which it is adopted in the running drive system in an electric car or a hybrid car. It is to be noted that the present invention may be adopted in all other apparatuses that utilize battery packs as well as in vehicles.

Figure 1:
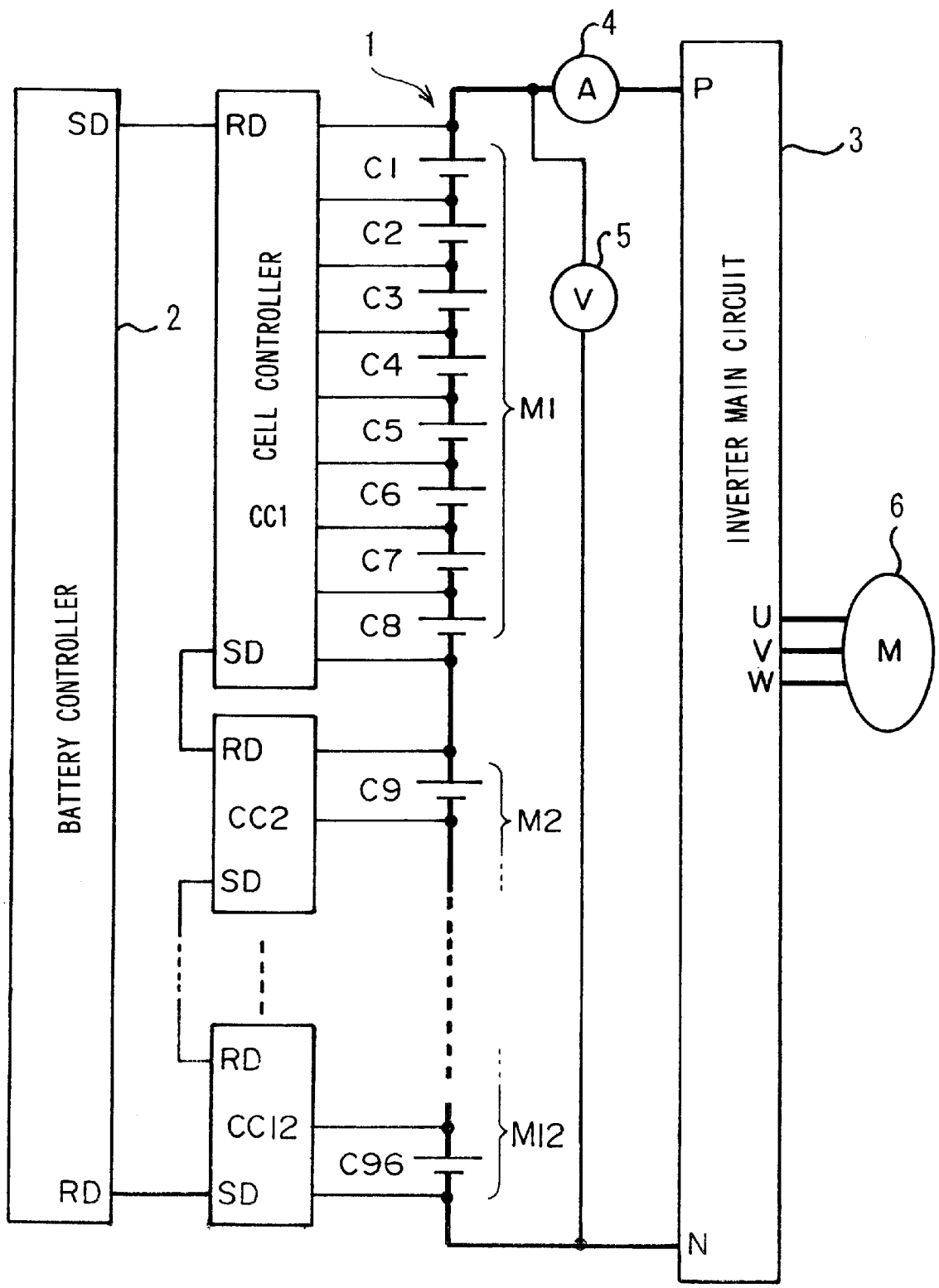
FIG. 1 shows the structure adopted in an embodiment of the battery pack diagnostic apparatus according to the present invention.
Figure 2:
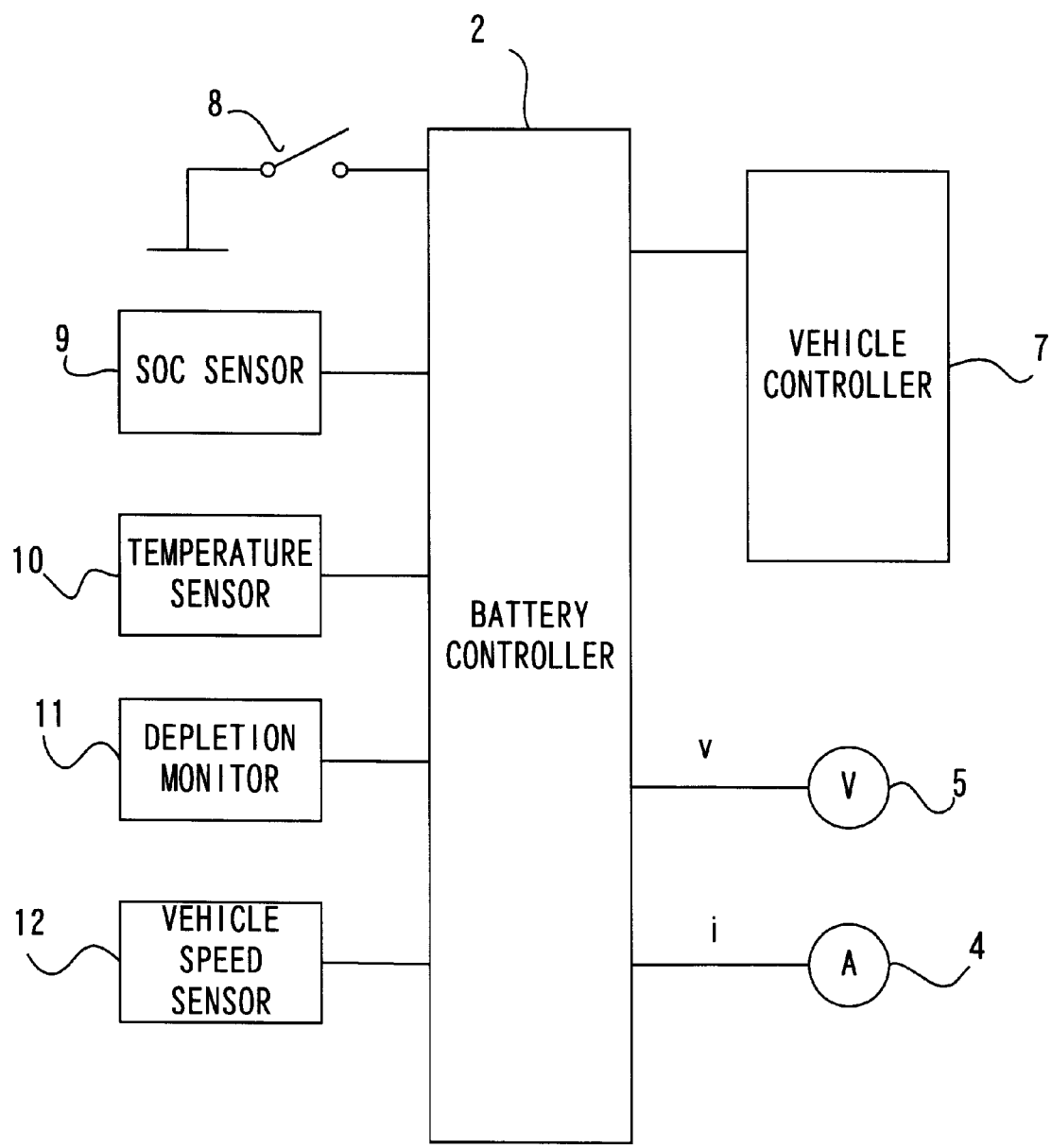
FIG. 2 shows the detailed structure adopted in the embodiment of the battery pack diagnostic apparatus according to the present invention as shown FIG. 1.

FIGS. 1 and 2 show the structure of the embodiment of the battery pack diagnostic apparatus according to the present invention adopted to the running drive system mentioned above. In the running drive system in the vehicle in the embodiment, DC power stored at a battery pack 1 is supplied to an invertor main circuit 3. The invertor main circuit 3 is capable of converting the supplied DC power to a three-phase AC power and supplying the converted power to a three-phase AC motor M for driving the vehicle so as to drive the vehicle.

In the battery pack 1 in the embodiment, 12 modules M1~M12 are constituted by connecting in series 96 cells C1~C96 and grouping the cells C1~C96 into units each having eight cells. In other words, each module is constituted of eight serially connected cells. It is to be noted that the number of cells constituting the battery pack and the number of cells constituting each module is not limited to the example in the embodiment.

In the embodiment, cell controllers CC1~CC12 manage the operation of the battery pack 1 in units of the modules M1~M12 respectively. In addition, a battery controller 2 manages the operations of all the modules M1~M12 via the cell controllers CC1~CC12. The battery controller 2 and the individual cell controllers CC1~CC12 are each constituted of a microcomputer and peripheral components such as memory.

The cell controllers CC1~CC12 measure voltages vc1~vc96 at the corresponding cells C1~C96 and output the measured values to the battery controller 2. The battery controller 2 engages in serial communication with the individual cell controllers CC1~CC12 via communication lines connected in loops. In other words, it receives information such as the cell voltages vc from the cell controllers CC1~CC12 and transmits charge/discharge commands and the like to the cell controllers CC1~CC12.

The battery controller 2 is connected with the cell controllers CC1~CC12. As shown in FIG. 2, the battery controller 2 is also connected with a main switch 8 of the vehicle, an SOC sensor 9 that detects the state of charge (SOC) of the battery pack 1, a temperature sensor 10 that detects the temperature Tb of the battery pack 1, a depletion monitor 11 that monitors the state of the capacity depletion at the battery pack 1, a vehicle speed sensor 12 that detects the running speed vsp of the vehicle, a voltmeter 5 that measures the voltage v at the battery pack 1, an ammeter 4 that measures the current i flowing through the battery pack 1 and the like. The battery controller 2 receives various types of information input from these devices and controls charge/discharge of the battery pack 1. In addition, the battery controller 2 detects a faulty cell by performing diagnosis on the battery pack 1 and outputs diagnostic results to a vehicle controller 7.

The battery pack temperature sensor 10, which is provided for each of the modules M1~M12, detects the temperature at the corresponding module among the modules M1~M12. The temperatures of the individual modules M1~M12 thus detected are transmitted to the battery controller 2 via the cell controllers CC1~CC12 respectively. The battery controller 2 calculates the average of the temperatures detected at the modules M1~M12 and sets the average thus calculated as the temperature Tb of the battery pack 1.

The depletion monitor 11 ascertains the extent of the capacity depletion having occurred at the battery pack 1 based upon the internal resistances at the battery modules M1~M12 detected by the cell controllers CC1~CC12 respectively and outputs a capacity depletion coefficient which is to be detailed later.

Figure 3:
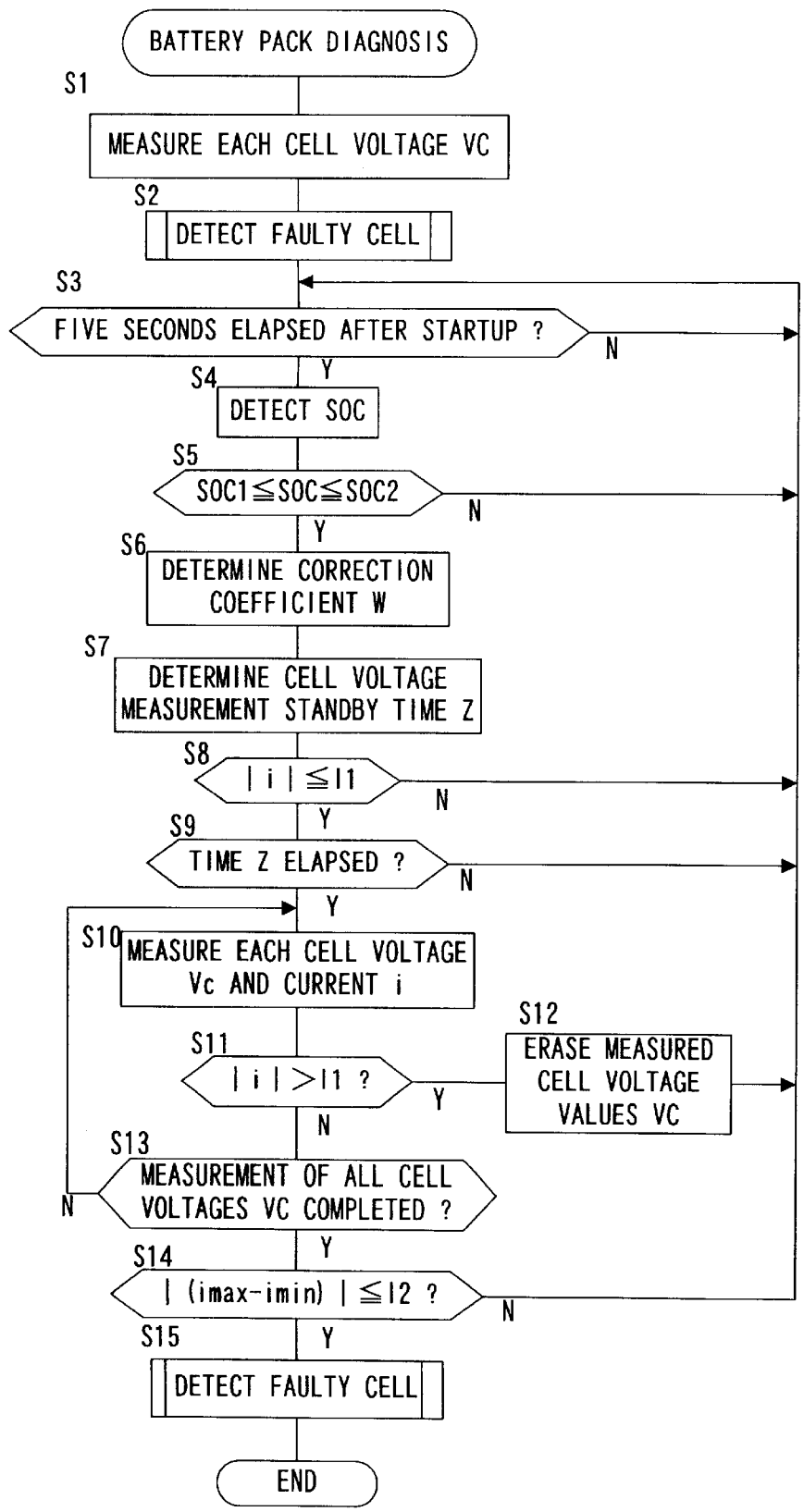
FIG. 3 illustrates a flow chart of the battery pack diagnostic program adopted in the embodiment of the battery pack diagnostic apparatus according to the present invention.

FIG. 3 presents a flow chart of the battery pack diagnostic processing implemented by the battery controller 2. Now, the battery pack diagnostic operation achieved in the embodiment is explained in reference to the flow chart.

Figure 4:
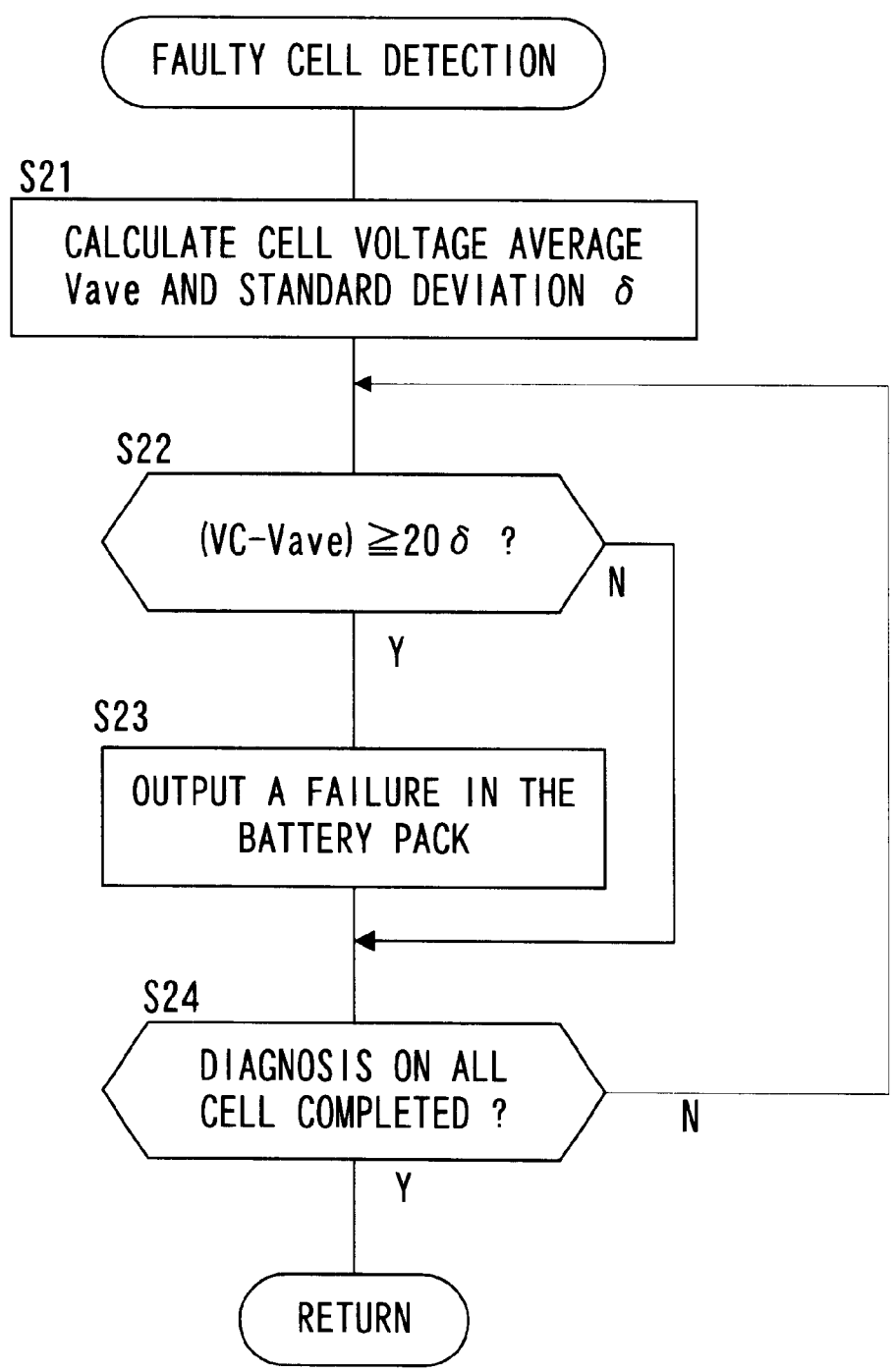
FIG. 4 illustrates a flow chart of the faulty cell detection routine implemented in the embodiment of the battery pack diagnostic apparatus according to the present invention.

The battery controller 2 executes the battery pack diagnostic program shown in FIG. 3 every predetermined time intervals once the main switch 8 of the vehicle is turned on. The following is a step-by-step explanation starting with step S1. In step S1, the individual cell controllers CC1~CC12 are engaged to measure the voltages vc1~vc96 at the cells C1~C96 and the results of the measurement are input through the cell controllers CC1~CC12 to the battery controller 2. In the following step S2, the faulty cell detection routine shown in FIG. 4 is executed. The faulty cell detection routine is executed prior to a vehicle run to detect any cell having an abnormal cell voltage vc while the battery pack 1 is in a substantially no-load state.

The following is a step-by-step explanation starting with step S21 in FIG. 4. In step S21, the average Vave and a standard deviation $\delta$ are calculated based on the voltages vc1~vc96 at the cells C1~C96 measured prior to the vehicle run. Once the average Vave and the standard deviation $\delta$ are calculated, the operation proceeds to step S22. In step S22, a decision is made for each cell as to whether or not its cell voltage vc (vc1~vc96) is normal by using the following expression (1).

$$(vc - Vave) \geq 20 \times \delta \tag{1}$$

Any cell having a cell voltage vc (vc1~vc96) that satisfies expression (1) is determined to be a faulty cell. It is to be noted that if the calculated standard deviation $\delta$ is smaller than a predetermined value, the predetermined value is assigned as the standard deviation $\delta$. The predetermined value may be, for instance, 10 (mV). If the cell voltage vc is determined to be abnormal, the operation proceeds to step S23. In step S23, information indicating a failure in the battery pack 1 and the specific faulty cell is output to the vehicle controller 7, before the operation proceeds to step S24. The operation also proceeds to step S24 if it is decided in step S22 that the cell voltage is normal. In step S24, a decision is made as to whether or not diagnosis on all the cells CC1~CC96 has been completed. If it is decided that the diagnosis on all the cells C1~C96 has not been completed, the operation returns to step S22 to perform diagnosis on the next cell. Once the diagnosis on all the cells C1~C96 is completed, the faulty cell detection routine ends. It is to be noted that a faulty cell may be detected through a method other than that described above.

After the pre-run battery pack diagnosis is completed through the faulty cell detection routine, the operation proceeds to step S3 in FIG. 3. In step S3, a decision is made as to whether or not five seconds have elapsed since the main switch 8 of the vehicle was turned on. Since the voltage at the battery pack 1 fluctuates greatly immediately after vehicle startup, the faulty cell detection routine includes the procedure in which the battery pack diagnosis to be implemented in step S4 and subsequent steps is not performed for the first five seconds after startup. Once it is decided that five seconds have elapsed, the operation proceeds to step S4. If it is decided that five seconds have not elapsed, the operation stays in step S3 in standby until five seconds elapse.

It is to be noted that although the processing in step S4 and subsequent steps is executed while the vehicle is in a running state, it may also be executed when the vehicle is not running. A decision as to whether or not the vehicle is in a running state is made based upon the vehicle speed vsp detected by the vehicle speed sensor 12. If the battery pack diagnostic processing is to be implemented while the vehicle is not running, there is a less possibility that the cell voltage vc is determined to be abnormal due to rapid cell depletion, since the charge/discharge quantities at the battery pack 1 are small in a stationary state.

In step S4, the state of charge at the battery pack 1 is detected by the SOC sensor 9. In the following step S5, a decision is made as to whether or not the state of charge at the battery pack 1 detected in step S4 is within a predetermined range (SOC1~SOC2).

Since the inconsistency among the cell voltages increases as the state of charge of the battery pack 1 becomes lower, the faulty cell diagnosis cannot be performed with accuracy.

Accordingly, the faulty cell diagnosis is implemented within the range over which the inconsistency among the cell voltages is not significant, i.e., while the state of charge at the battery pack 1 is within the range described above (SOC1~SOC2). This state of charge range (SOC1~SOC2) should be set in correspondence to the type of the battery in use. The range should be set, for instance, at 30–100% for a lithium-ion battery. If it is decided that the state of charge at the battery pack 1 is not within the range set as described above, the operation returns to step S3.

If, on the other hand, it is decided that the state of charge at the battery pack 1 is within the range set, the operation proceeds to step S6. In step S6, a correction coefficient W to be used to correct a cell voltage measurement standby time Z is calculated. Since it usually takes a while for the terminal voltage to stabilize after current starts to flow in a battery, the cell voltage measurement should be performed only after the terminal voltage has stabilized to ensure accuracy. The length of time to elapse before the terminal voltage stabilizes varies depending upon the type of the battery and also depending upon the battery temperature and extent of the capacity depletion. The correction coefficient W is calculated as the reciprocal of the product of the temperature coefficient k1 and the capacity depletion coefficient k2 set for the battery pack 1, through expression (2).

$$W=1/(k1 \cdot k2) \quad (2)$$

The temperature coefficient k1 is obtained through a look-up operation in which the temperature coefficient k1 corresponding to the battery pack temperature Tb detected by the temperature sensor 10 is looked up in a temperature coefficient table prepared in advance. In the temperature coefficient table, the temperature coefficients corresponding to varying battery pack temperatures Tb are set in advance for different types of batteries. It is to be noted that the temperature coefficient k1 becomes higher as the battery pack temperature Tb increases. In the embodiment, k1 is set at 0.93 when the battery pack temperature Tb is 16° C. and at 1.0 when the battery pack temperature Tb is 20° C.

The depletion coefficient obtained at the depletion monitor 11, which monitors the extent of capacity depletion at the battery pack 1 is used for the capacity depletion coefficient k2. The depletion coefficient k2 becomes lower as the process of depletion advances. For instance, the depletion coefficient k2 becomes lower as the battery pack has been used over a longer period of time or as the battery pack has been left in a fully charged state over a longer period of time. In this embodiment, the depletion coefficient k2 is set at 0.80 when the extent of depletion is 80% and at 1.00 when the battery pack 1 is new.

After calculating the correction coefficient W in step S6, the operation proceeds to step S7. In step S7, the measurement standby time Z to elapse before measuring the cell voltage vc is determined. As explained earlier, the length of time to elapse before the terminal voltage becomes stable after the current stars to flow through the battery varies depending upon the type of battery and accordingly, the cell voltage measurement standby time Z is set in correspondence to the type of the battery in use. The cell voltage measurement standby time Z is corrected in correspondence to the temperature at the battery pack 1 and the extent of the capacity depletion by using the correction coefficient W. In the embodiment, the precorrection measurement standby time Z to elapse before measuring the cell voltage vc is set at 5 (sec).

Since k1 is 0.93 when the battery pack temperature Tb is 16° C. and the depletion coefficient k2 is 0.83 when the extent of the depletion is 80%, the corresponding correction coefficient W is calculated through expression (2) as $$W=1/(0.93 \times 0.80) \approx 1.344 \quad (2').$$

The corrected measurement standby time Z' can then be calculated by using the correction coefficient W calculated through expression (2') and the measurement standby time Z (=5) for measuring the cell voltage vc through expression (3).

$$Z'=5 \times 1.344=6.72 \quad (3)$$

Figure 5:
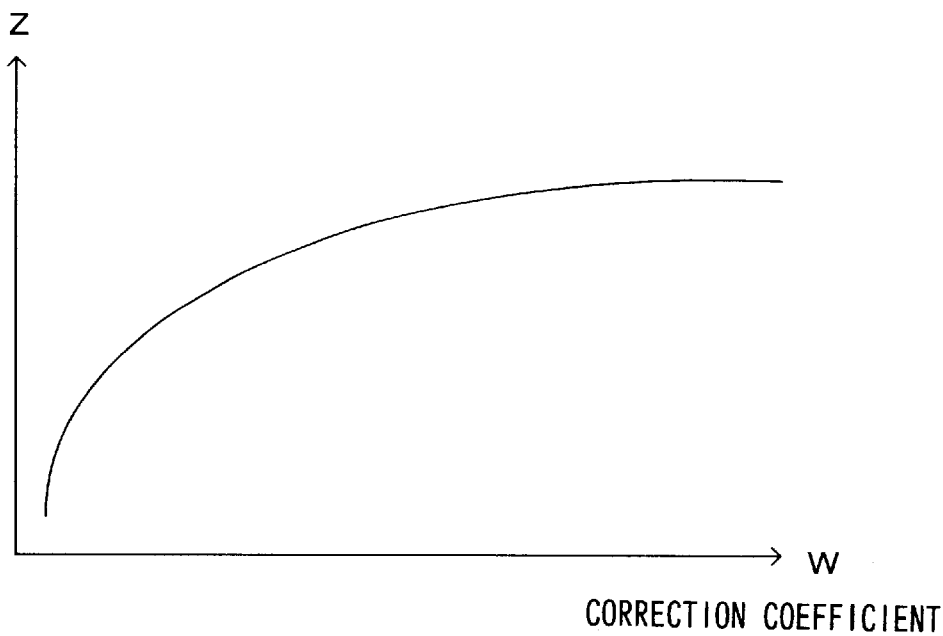
FIG. 5 shows the relationship between the correction coefficient W and the cell voltage measurement standby time Z.

FIG. 5 shows the relationship between the correction coefficient W and the cell voltage measurement standby time Z. As, the temperature Tb of the battery pack 1 becomes lower, the temperature coefficient k1 becomes reduced and thus, the correction coefficient W increases. Since the correction coefficient W increases as the battery pack temperature Tb becomes lower, the cell voltage measurement standby time Z becomes lengthened. In other words, the measurement of the cell voltage vc is started only after terminal voltage becomes fully stabilized even when the battery temperature Tb is low, to achieve highly reliable diagnosis without being affected by the battery temperature Tb.

In addition, as the extent of capacity depletion at the battery pack 1 increases, the depletion coefficient k2 becomes smaller and, thus, the correction coefficient W increases. In other words, the cell voltage measurement standby time Z becomes lengthened as the extent of the capacity depletion at the battery pack 1 increases. Thus, by starting the cell voltage measurement only after the terminal voltage becomes fully stabilized even when the terminal voltage fluctuates greatly due to an advanced state of capacity depletion at the battery pack 1, highly reliable diagnosis is achieved without being affected by the battery pack depletion.

After determining the measurement standby time Z to elapse before measuring the cell voltage vc in step S7, the operation proceeds to step S8. In step S8, a decision is made as to whether or not the absolute value of the current i flowing through the battery pack 1 is equal to or smaller than a predetermined value I1. A value that enables reliable detection of a faulty cell based upon the measured value of the cell voltage vc is set for the predetermined value I1. Namely, a current value that enables detection of a faulty cell based upon the measured value of the cell voltage vc having undergone a change resulting from the change in the current i should be set for the predetermined value I1. It is to be noted that the predetermined value I1 varies depending upon the type of the battery pack, the cell structure and the quantity of cells. In the embodiment, the predetermined value I1 is equal to or lower than 5A representing a current value in a signal input standby state.

If it is decided that the relationship expressed as $|i| \leq I1$ is satisfied, the operation proceeds to step S9. In step S9, a decision is made as to whether or not the state $|i| \leq I1$ determined to manifest in step S8 has been sustained over the cell voltage measurement standby time Z. In other words, a decision is made as to whether or not the time Z has elapsed since the decision-making process in step S8 started to determine whether or not the relationship expressed as $|i| \leq I1$ is satisfied. If it is decided that the time Z has elapsed, the operation proceeds to step S10, whereas the operation returns to step S3 by halting the battery pack diagnosis in progress while the vehicle is running. In step S10, the voltages vc at the individual cells C1~C96 are measured by the corresponding cell controllers CC1~CC12 and the current i flowing through the battery pack 1 is measured by the ammeter 4. Since it is difficult to measure the cell voltages vc1~vc96 of the 96 cells C1~C96 at once, the cell voltages vc are measured sequentially. For this reason, the current i flowing through the battery pack 1 is constantly monitored while the cell voltages vc are measured sequentially, and a decision is made in step S11 as to whether or not the absolute value of the current i exceeds the predetermined value I1. If it is determined that the absolute value of the current i exceeds the predetermined value I1, the operation proceeds to step S12. In step S12, all the measured values of the cell voltages vc are erased and the battery pack diagnosis in progress while the vehicle is running is halted before the operation returns to step S3. In other words, if the absolute value of the current i flowing through the battery pack 1 exceeds the predetermined value I1 during the measurement of the cell voltages vc, a measurement of the cell voltages vc is started anew.

If the absolute value of the current i is equal to or lower than the predetermined value I1, the operation proceeds to step S13. In step S13, a decision is made as to whether or not the cell voltages vc1~vc96 at all the cells C1~C96 have been measured. If it is decided that the measurement has not yet been completed, the operation returns to step S9 to measure the cell voltage vc at another cell and the current i.

If it is decided that the cell voltage measurement vc1~vc96 at all the cells C1~C96 has been completed, the operation proceeds to step S14. In step S14, a decision is made as to whether or not the absolute value of the difference between the maximum value imax and the minimum value imin of the current i flowing through the battery pack 1 measured during the measurement of the cell voltages vc1~vc96 is equal to or lower than a predetermined value I2. Namely, a decision is made as to whether or not the relationship expressed in the following mathematical expression (4) is satisfied.

$$|(imax - imin)| \leq I2 \quad (4)$$

The predetermined value I2 must satisfy the relationship expressed in expression (5), for instance.

$$I2 \leq 2 \cdot I1 \quad (5)$$

If it is decided that the absolute value of the difference between the maximum value imax and the minimum value imin of the current i flowing through the battery pack 1 during the measurement of cell voltage vc exceeds the predetermined value I2, the operation returns to step S3 to start the measurement of cell voltage vc anew.

If, on the other hand, it is decided that the absolute value of the difference between the maximum current imax and the minimum current imin obtained during the measurement of the cell voltages vc is equal to or lower than the predetermined value I2, the operation proceeds to step S15. In step S15, a faulty cell with an abnormal cell voltage vc is detected by executing the faulty cell detection routine in FIG. 4 explained earlier. Namely, the average Vave and the standard deviation δ are calculated based on the voltages vc1~vc96 at the individual cells C1~C96 measured under the measuring conditions mentioned above while the vehicle is running and a decision is made for each cell by using expression (1) as to whether or not its cell voltage vc is normal. If it is decided that a cell voltage vc is abnormal, information indicating a failure in the battery pack 1 and the specific faulty cell is output to the vehicle controller 7. When the diagnosis on all the cells C1~C96 is completed, the processing ends.

In the embodiment described above, in which measurement of the cell voltage vc starts when the absolute value of the current i flowing through the battery pack 1 has sustained a level equal to or lower than the predetermined value I1 over the specific length of time Z, accurate diagnosis can be implemented on the battery pack 1 even when the battery pack 1 is in normal use, e.g., even while the vehicle is running. In addition, since the specific length of time Z, which constitutes a condition for starting a measurement of the cell voltages vc, is set in correspondence to the type of the battery pack 1, optimal diagnosis start timing can be set in conformance to the type of the battery pack 1 in use to achieve highly reliable diagnostic results. Furthermore, as the specific length of time Z set in correspondence to the type of the battery pack 1 is corrected based upon the temperature Tb and the extent of depletion of the battery pack 1, optimal diagnosis start timing corresponding to the state of the battery pack 1 can be set, so that highly reliable diagnostic results are achieved.

Moreover, a current value that allows a faulty cell to be detected even when the cell voltage has changed due to a change in the current is set as the predetermined value I1 to be used to judge the level of the current i flowing through the battery pack 1 in the embodiment. As a result, even when the cell voltage has changed due to a change in the current i flowing through the battery pack 1 during a measurement of the cell voltage vc, a faulty cell voltage can be detected accurately. In addition, the measurement of cell voltage vc is started anew if the absolute value of the current i flowing through the battery pack 1 exceeds the predetermined value I1 during a the measurement of cell voltage vc. Thus, even if the absolute value of the current i exceeds the predetermined value I1 and, as a result, a cell voltage change occurs that would otherwise make faulty cell detection impossible, the faulty cell can still be detected accurately.

Since the measurement of cell voltage vc is started anew if the absolute value of the difference between the maximum value imax and the minimum value imin of the current i flowing through the battery pack 1 exceeds the predetermined value I2 during the measurement of cell voltage vc, a faulty cell can still be detected accurately and the diagnostic reliability is improved.

The battery pack diagnostic method and battery pack diagnostic apparatus according to the present invention are not limited to the above explained embodiments and may be adopted in conjunction with all types of battery packs to detect a faulty cell based upon measured cell voltages by starting cell voltage measurement when the absolute value of the current flowing through the battery pack has sustained a level equal to or lower than a predetermined value over a specific length of time.

The disclosure of the following priority application is herein incorporated by reference: Japanese Patent Application No. 2000-217358, filed Jul. 18, 2000.

What is claimed is:

1. A battery pack diagnostic apparatus that performs diagnosis on a plurality of cells constituting a battery pack, comprising:

a current measuring instrument that measures current flowing through the battery pack;

a voltage measuring instrument that measures a cell voltage at the terminals of each cell;

a measurement control device that starts a cell voltage measurement by the voltage measuring instrument when an absolute value of the current flowing through the battery pack measured by the current measuring instrument has sustained a level equal to or lower than a predetermined value over a specific length of time; and a faulty cell detection device that detects a faulty cell based upon the cell voltage measured during the cell voltage measurement at individual cells performed by the voltage measuring instrument.

2. A battery pack diagnostic apparatus according to claim 1, wherein;
the specific length of time is set in correspondence to the type of the battery pack.

3. A battery pack diagnostic apparatus according to claim 2, further comprising:
a temperature measuring instrument that measures a temperature of the battery pack; and
a depletion detection device that detects an extent of depletion at the battery pack, wherein;
the specific length of time set in correspondence to the type of the battery pack is corrected in conformance to the temperature of the battery pack measured by the temperature measuring instrument and the extent of depletion of the battery pack detected by the depletion detection device.

4. A battery pack diagnostic apparatus according to claim 1, wherein;
the predetermined value for the current flowing through the battery pack is a current value so that a faulty cell detection can be performed even when the cell voltage changes as a result of a change in the current.

5. A battery pack diagnostic apparatus according to claim 1, wherein;
the measurement control device starts measurement of cell voltages anew if the absolute value of the current flowing through the battery pack exceeds the predetermined value during the cell voltage measurement performed by the voltage measuring instrument.

6. A battery pack diagnostic apparatus according to claim 1, wherein;
the measurement control device starts the cell voltage measurement anew if an absolute value of the difference between a maximum value and a minimum value of the current flowing through the battery pack exceeds a predetermined value during the cell voltage measurement performed by the voltage measuring instrument.

7. A battery pack diagnostic apparatus that performs diagnosis on a plurality of cells constituting a battery pack, comprising:
a current measurement means for measuring current flowing through the battery pack;
a voltage measurement means for measuring cell voltage at the terminals of each cell;
a measurement control means for starting a cell voltage measurement by the voltage measurement means when an absolute value of the current flowing through the battery pack measured by the current measurement means has sustained a level equal to or lower than a predetermined value over a specific length of time; and
a faulty cell detection means for detecting a faulty cell based upon the cell voltage measured during the cell voltage measurement at individual cells performed by the voltage measuring means.

8. A battery pack diagnostic apparatus that performs diagnosis on a plurality of cells constituting a battery pack, comprising:
a current measuring instrument that measures current flowing through the battery pack;
a voltage measuring instrument that measures cell voltage at the terminals of each cell;
a measurement control device that starts a cell voltage measurement by the voltage measuring instrument when an absolute value of the current flowing through the battery pack measured by the current measuring instrument has sustained a level equal to or lower than a predetermined value over a specific length of time; and
a faulty cell detection device that detects a faulty cell based upon the cell voltage measured during the cell voltage measurement at individual cells performed by the voltage measuring instrument, wherein;
the measurement control device starts cell voltage measurement anew if the absolute value of the current flowing through the battery pack exceeds the predetermined value or an absolute value of a difference between a maximum value and a minimum value of the current flowing through the battery pack exceeds a predetermined value during a cell voltage measurement performed by the voltage measuring instrument.

9. A battery pack diagnostic apparatus according to claim 8, wherein;
a current value that enables a faulty cell detection even when the cell voltage changes as a result of a change in the current is set as the predetermined value for the current flowing through the battery pack.

10. A battery pack diagnostic method for performing diagnosis on a plurality of cells constituting a battery pack, comprising the steps of:
measuring the current flowing through the battery pack;
measuring cell voltage at the terminals of each cell when an absolute value of the measured current flowing through the battery pack has sustained a level equal to or lower than a predetermined value over a specific length of time; and
detecting a faulty cell based upon the cell voltages measured during the cell voltage measurement.

11. A battery pack diagnostic method for performing diagnosis on a plurality of cells constituting a battery pack, comprising;
measuring the current flowing through the battery pack,
measuring a cell voltage at the terminals of each cell when the absolute value of the measured current flowing through the battery pack has sustained a level equal to or lower than a predetermined value over a specific length of time;
measuring the cell voltage anew if the absolute value of the current flowing through the battery pack exceeds the predetermined value or if an absolute value of the difference between a maximum value and a minimum value of the measured current flowing through the battery pack exceeds a predetermined value during cell voltage measurement; and
detecting a faulty cell based upon the cell voltage measured during the cell voltage measurement.

* * * * *